(12) United States Patent
Nakamura et al.

(10) Patent No.: US 8,551,368 B2
(45) Date of Patent: Oct. 8, 2013

(54) CONDUCTIVE PASTE FOR FORMING A SOLAR CELL ELECTRODE

(75) Inventors: Masami Nakamura, Kunitachi (JP); Naoto Shindo, Ome (JP); Tadashi Kanasaku, Kokubunji (JP)

(73) Assignee: Shoei Chemical Inc., Tokyo (JP)

( * ) Notice: Subject to any disclaimer, the term of this patent is extended or adjusted under 35 U.S.C. 154(b) by 96 days.

(21) Appl. No.: 12/925,343

(22) Filed: Oct. 20, 2010

(65) Prior Publication Data
US 2011/0095240 A1    Apr. 28, 2011

(30) Foreign Application Priority Data
Oct. 28, 2009   (JP) .................................. 2009-247220

(51) Int. Cl.
*H01B 1/22*      (2006.01)

(52) U.S. Cl.
USPC .......................................................... 252/514

(58) Field of Classification Search
USPC .......................................................... 252/514
See application file for complete search history.

(56) References Cited

U.S. PATENT DOCUMENTS

| | | | |
|---|---|---|---|
| 4,945,071 A | 7/1990 | Friesen et al. | |
| 5,066,621 A | 11/1991 | Akhtar | |
| 5,188,990 A * | 2/1993 | Dumesnil et al. | 501/19 |
| 5,240,884 A * | 8/1993 | Herrington et al. | 501/19 |
| 6,071,437 A | 6/2000 | Oya | |
| 2009/0188555 A1 | 7/2009 | Castillo et al. | |
| 2009/0199897 A1 | 8/2009 | Naito et al. | |

FOREIGN PATENT DOCUMENTS

| | | |
|---|---|---|
| JP | 62 128946 | 6/1987 |
| JP | 02-293344 | 12/1990 |
| JP | 04-270140 | 9/1992 |
| JP | 5-128910 A | 5/1993 |
| JP | 09-306236 | 11/1997 |
| JP | 10-029834 | 2/1998 |
| JP | 10-326522 | 12/1998 |
| JP | 11-213754 | 8/1999 |
| JP | 2001-093326 | 4/2001 |
| JP | 2001-118425 | 4/2001 |
| JP | 2004-207493 | 7/2004 |
| JP | 2004-250276 | 9/2004 |

(Continued)

OTHER PUBLICATIONS

Korean Office Action dated Nov. 28, 2011 and Concise Explanation of Relevance in English (5 pages).

(Continued)

*Primary Examiner* — Mark Kopec
(74) *Attorney, Agent, or Firm* — Flynn, Thiel, Boutell & Tanis, P.C.

(57) ABSTRACT

A conductive paste for forming a solar cell electrode, including: a conductive powder containing silver as a main component; glass frit; and an organic vehicle, wherein the glass frit contains tellurium glass frit having tellurium oxide as a network-forming component. The conductive paste of the present invention makes it possible to form a solar cell electrode having a low dependence on firing temperature without causing problems due to fire-through into the substrate, and to thereby obtain a solar cell having good solar cell characteristics.

9 Claims, 2 Drawing Sheets

(56) References Cited

FOREIGN PATENT DOCUMENTS

| | | |
|---|---|---|
| JP | 2005-019398 | 1/2005 |
| JP | 2006 342044 | 12/2006 |
| JP | 2007-008802 | 1/2007 |
| JP | 2008 135565 | 6/2008 |
| JP | 2008 147154 | 6/2008 |
| JP | 2008 251324 | 10/2008 |
| JP | 2008-543080 | 11/2008 |
| JP | 2009-194121 | 8/2009 |
| JP | 2009-209032 | 9/2009 |
| JP | 2010-184852 | 8/2010 |
| JP | 4754655 | 8/2011 |
| KR | 10-2009-0086355 A | 8/2009 |
| WO | WO 2009/097264 | 8/2009 |
| WO | WO 2010/016186 | 2/2010 |

OTHER PUBLICATIONS

Chinese Office Action dated Feb. 23, 2012 (Chinese language—4 pages); and Concise Explanation of Relevance (English language—1 page).

Japanese Office Action dated May 17, 2012 and an English summary thereof, along with a JPO Notification dated May 10, 2012.

Canadian Office Action dated Oct. 12, 2012 (2 pages).

English summary of a Third Party Submission, along with a JPO Notification dated Aug. 27, 2012.

Japanese Office Action dated Feb. 21, 2013 with English Concise Explanation of Relevance (5 pgs.).

\* cited by examiner

CONDUCTIVE PASTE FOR FORMING A SOLAR CELL ELECTRODE

BACKGROUND OF THE INVENTION

1. Field of the Invention

The present invention relates to a fired-type conductive paste containing glass frit and a conductive powder comprising silver as a main component and used for forming a solar cell electrode.

2. Description of the Related Art

Conventionally, an ordinary solar cell device is provided with a silicon semiconductor substrate, a diffusion layer, an antireflective film, a rear electrode and a front electrode (hereunder sometimes called a "light-receiving electrode"). When forming the front electrode in particular, the electrode is formed by screen printing, stencil printing or the like, using a conductive paste made by mixing conductive particles composed mainly of silver with glass frit, an organic vehicle, etc.

As one example, in the crystalline silicon solar cell shown in FIG. 1, a diffusion layer 3 is formed in the front surface (light-receiving surface) area of a p-type crystalline silicon substrate 4, which is formed with a concave-convex surface structure called a textured structure. The diffusion layer 3, which is formed by diffusing an impurity such as phosphorus (P) into the semiconductor substrate 4 from the light-receiving surface thereof, is a region exhibiting the opposite conductivity type from the semiconductor substrate 4 (in the present example, the opposite conductivity type is explained as n-type). The n-type diffusion layer 3 is formed for example by placing the semiconductor substrate 4 in a diffusion furnace, and heating it in phosphorus oxychloride ($POCl_3$) or the like. An insulating antireflective film 2 is formed from silicon nitride, silicon oxide, titanium oxide or the like on this diffusion layer 3 to provide an antireflective function while at the same time protecting the solar cell device. In the case of silicon nitride (hereunder, "SiN") for example, the film is formed by plasma CVD or the like using a mixed gas of silane ($SiH_4$) and ammonia ($NH_3$). The antireflective film 2 is formed with a thickness of about 5 to 100 nm and a refractive index of about 1.8 to 2.3, taking into consideration the difference between this refractive index and that of the semiconductor substrate 4 and the like.

Next, the aforementioned conductive paste is printed or coated in a grid form on the antireflective film 2 by screen printing or the like, and fired at about 500 to 900° C. to form a front electrode 1. Normally, electrical contact between the front electrode 1 and the n-type diffusion layer 3 is achieved when antireflective film 2 is melted by the action of the glass frit in the conductive paste and removed during firing. This is commonly called "fire-through".

A rear electrode 5 is formed on the rear side of the semiconductor substrate 4 together with a highly concentrated p-type BSF (Back Surface Field) layer doped with aluminum or the like.

To achieve proper fire-through, glasses having a good solubility with the antireflective film 2 have been preferably used as the glass frit in the conductive pastes. Among them, especially glass containing lead oxide has often been used for the glass frit in conventional conductive pastes for forming front electrodes because the glass softening point is easy to adjust and the glass provides good adhesiveness with the substrate (adhesive strength), allows for relatively good fire-through and results in superior solar cell characteristics.

For example, lead borosilicate glass frit is used in the silver pastes for forming solar cell electrodes described in Japanese Patent Publication Nos. 11-213754 A, 2001-093326 A and 10-326522 A, while Japanese Patent Publication No. 2001-118425 A describes lead borate glass frit in addition to lead borosilicate glass frit.

Regarding the aforementioned fire-through, however, problems with variation in adhesive strength and failure to obtain stable ohmic contact between the front electrode 1 and the n-type diffusion layer 3 of the semiconductor substrate 4 have occurred when the front electrode 1 does not penetrate through the antireflective film 2 due to variation in the effect of the glass frit and the like when the front electrode 1 is fired. Insufficient ohmic contact can cause loss during output, resulting in lower conversion efficiency of the solar cell and a decline in the current-voltage characteristics.

As described in paragraph [0004] of Japanese Patent Publication No. 10-326522 A, paragraph [0017] of Japanese Patent Publication No. 2004-207493 A, etc, meanwhile, there has been known another problem in which excessive fire-through may also produce inferior voltage characteristics. Since the antireflective film 2 can be no more than about 5 to 100 nm thick as described above, if the front electrode 1 penetrates through the antireflective film 2 and then through the n-type diffusion layer 3 below to intrude into the semiconductor substrate 4, the p-n junction may be broken, and the fill factor ("FF") obtained from the current-voltage characteristic measurements may be adversely affected. Such penetration may become more likely and harder to control if in the future the n-type diffusion layer 3 is made still thinner in an effort to improve efficiency.

FIG. 2 shows the interface between a front electrode and a semiconductor substrate of a commercial solar cell substrate as seen through a transmission electron microscope (TEM). Lead glass is used in the front electrode of this commercial solar cell. In FIG. 2, a lead glass layer 6 containing a silver component from the conductive paste is present between the front electrode layer 1a and the SiN layer 2, which is an antireflective film, and part 7 of this glass layer penetrates through the SiN layer 2 to contact a silicon substrate (or n-type diffusion layer) 4, but in part 8 there is too much fire-through, and the glass can be seen as protrusions intruding deeply into the interior of the semiconductor substrate 4.

As a separate issue, increased environmental awareness in recent years has led to a desire for a switchover to lead-free materials and parts in solar cells. Alternative materials and parts are therefore being developed that will provide ease of adjusting the softening point of the glass, good adhesiveness to the substrate (high adhesive strength) and good fire-through, as in the case of the conventional lead glass, with the aim of providing superior solar cell characteristics.

For example, attempts have been made to form front electrodes using zinc borosilicate glass frit in Japanese Patent Publication No. 2001-118425 A, bismuth borosilicate and zinc borosilicate glass frits in Japanese Patent Publication No. 10-326522 A, borosilicate glass frit in Japanese Patent Publication No. 2008-543080 A (Japanese translation of WO 2006/132766) and zinc borate glass frit in Japanese Patent Publication No. 2009-194121 A. However, the research of the present inventors has shown that even using such lead-free glass, fire-through is sometimes difficult to control, including cases of insufficient fire-through, failure to achieve ohmic contact, or, as in FIG. 2, excessive fire-through such that part of the front electrode intrudes deeply into the semiconductor substrate.

On the other hand, tellurium glass is known as a glass for use in fluorescent display tube sealing applications (Japanese Patent Publication No. 10-029834 A) and optical fiber material applications (Japanese Patent Publication No. 2007-008802 A). In general, tellurium glass is known to have a low melting point, to be highly durable and to easily dissolve silver in solid solution, but it also has extremely low reactivity with silicon oxide, and since silicon-type antireflective films have been popular in recent years, there has been little interest in tellurium glass for forming the front electrodes of solar cells.

SUMMARY OF THE INVENTION

It is an object of the present invention to provide a conductive paste for forming a solar cell electrode, containing no lead, but capable of forming an electrode providing good solar cell characteristics.

The present invention comprises the following.

(1) A conductive paste for forming a solar cell electrode, including: a conductive powder comprising silver as a main component; glass frit; and an organic vehicle, wherein the glass frit contains tellurium glass frit having tellurium oxide as a network-forming component.

(2) The conductive paste for forming a solar cell electrode according to (1) above, wherein the tellurium glass frit contains 25 to 90 mol % of tellurium oxide.

(3) The conductive paste for forming a solar cell electrode according to (1) or (2) above, wherein the tellurium glass frit contains one or more of tungsten oxide and molybdenum oxide.

(4) The conductive paste for forming a solar cell electrode according to (3) above, wherein the tellurium glass frit contains a total of 5 to 60 mol % of one or more of the tungsten oxide and the molybdenum oxide.

(5) The conductive paste for forming a solar cell electrode according to (3) or (4) above, wherein the tellurium glass frit contains one or more of zinc oxide, bismuth oxide and aluminum oxide.

(6) The conductive paste for forming a solar cell electrode according to (1) above, wherein the tellurium glass frit contains the following components:

tellurium oxide: 25 to 90 mol % at least one of tungsten oxide and molybdenum oxide:

5 to 60 mol % in total zinc oxide: 0 to 50 mol % bismuth oxide: 0 to 25 mol % aluminum oxide: 0 to 25 mol %.

(7) The conductive paste for forming a solar cell electrode according to any one of (1) through (6) above, wherein the tellurium glass frit is contained in the amount of 0.1 to 10 parts by weight per 100 parts by weight of the conductive powder.

With the present invention, it is possible to obtain a conductive paste capable of forming a solar cell electrode with good solar cell characteristics without containing any lead glass as in the past. By preparing a solar cell using the conductive paste of the present invention, it is possible to obtain a solar cell having performance and characteristics well comparable with or superior to those of conventional solar cells.

DETAILED DESCRIPTION OF THE PREFERRED EMBODIMENTS

One embodiment of the conductive paste and solar cell device according to the present invention is explained below, but the scope of the present invention is not limited thereto.

The conductive paste of the present invention is explained first. In the conductive paste of the present invention, glass frit and a conductive powder comprising silver as a main component are dispersed in an organic vehicle. The individual components are explained below.

The conductive powder is not particularly limited as long as it contains silver as a main component, and may have a spherical-, flake- or dendrite-shape or the like as conventionally used. In addition to pure silver powder, it is possible to use silver-coated composite powder having at least a silver layer on the surface thereof, an alloy comprising silver as a main component, or the like. The average particle size of the conductive powder is preferably 0.1 to 10 μm. It is also possible to use a mixture of two or more conductive powders having different average particle sizes, particle size distributions, shapes or the like, or a mixture of silver powder with one or more conductive powders other than silver. There are no particular limitations on the metals that can be complexed, alloyed or mixed with the silver powder as long as the function effects of the present invention are not adversely affected, and examples include aluminum, gold, palladium, copper, nickel and the like. From the standpoint of conductivity however it is desirable to use pure silver powder.

The present invention is characterized in that tellurium glass comprising tellurium oxide as a network-forming component is used as glass frit in the electrode-forming conductive paste. The conductive paste of the present invention is especially suited to forming the electrode on the front surface (light-receiving surface) of a solar cell, and an electrode providing superior solar cell characteristics can be obtained by printing this paste onto an antireflective film of silicon nitride, etc., on a solar cell surface and firing it.

In the tellurium glass (hereunder "Te glass") used in the present invention, tellurium oxide does not form glass by itself but is a network-forming component forming the principal structure of glass, and the content thereof is 25 to 90 mol % (as oxide) with respect to the total of the glass frit. When this content is below 25 mol % or above 90 mol % vitrification becomes difficult. The content range is preferably from 30 to 80 mol % and more preferably from 40 to 70 mol %.

Figure 1:
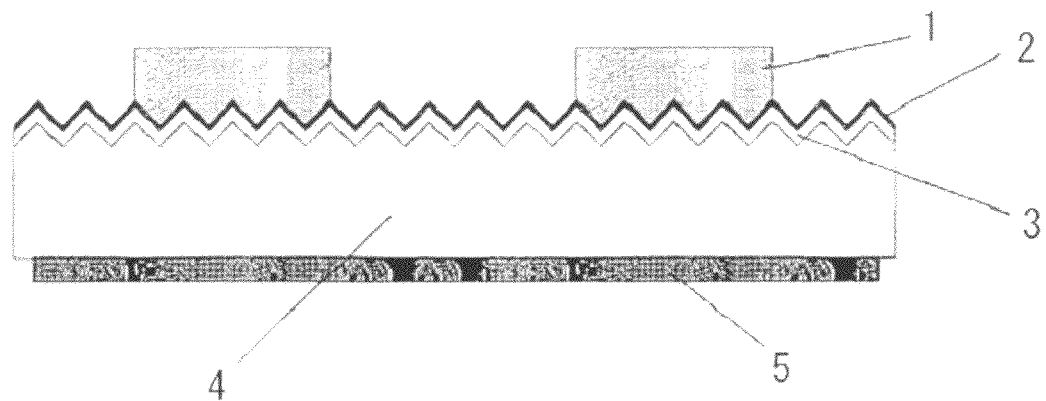
FIG. 1 is a diagram of a solar cell device.
Figure 2:
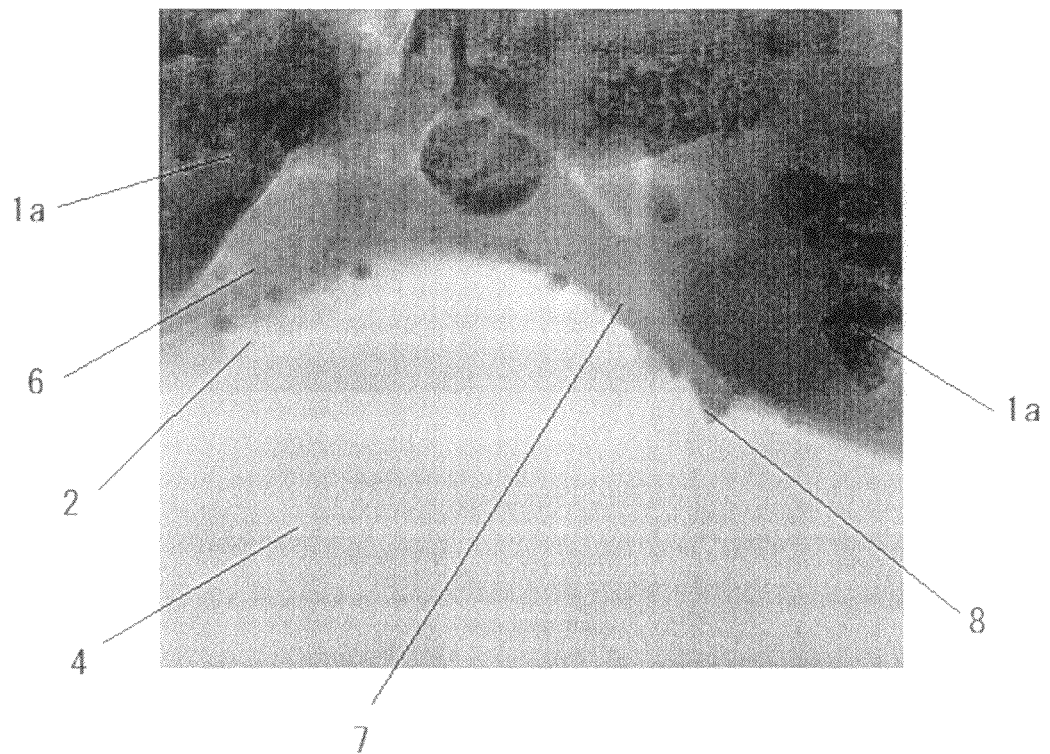
FIG. 2 is a TEM photograph of the interface between a substrate and a front electrode using conventional lead glass.

The research of the present inventors has shown that when the conductive paste containing Te glass is used to form the front electrode of a solar cell, there is almost no deep penetration into the semiconductor substrate by the front electrode as shown in FIG. 2, fire-through is easy to control, and sufficient ohmic contact can be obtained.

Figure 3:
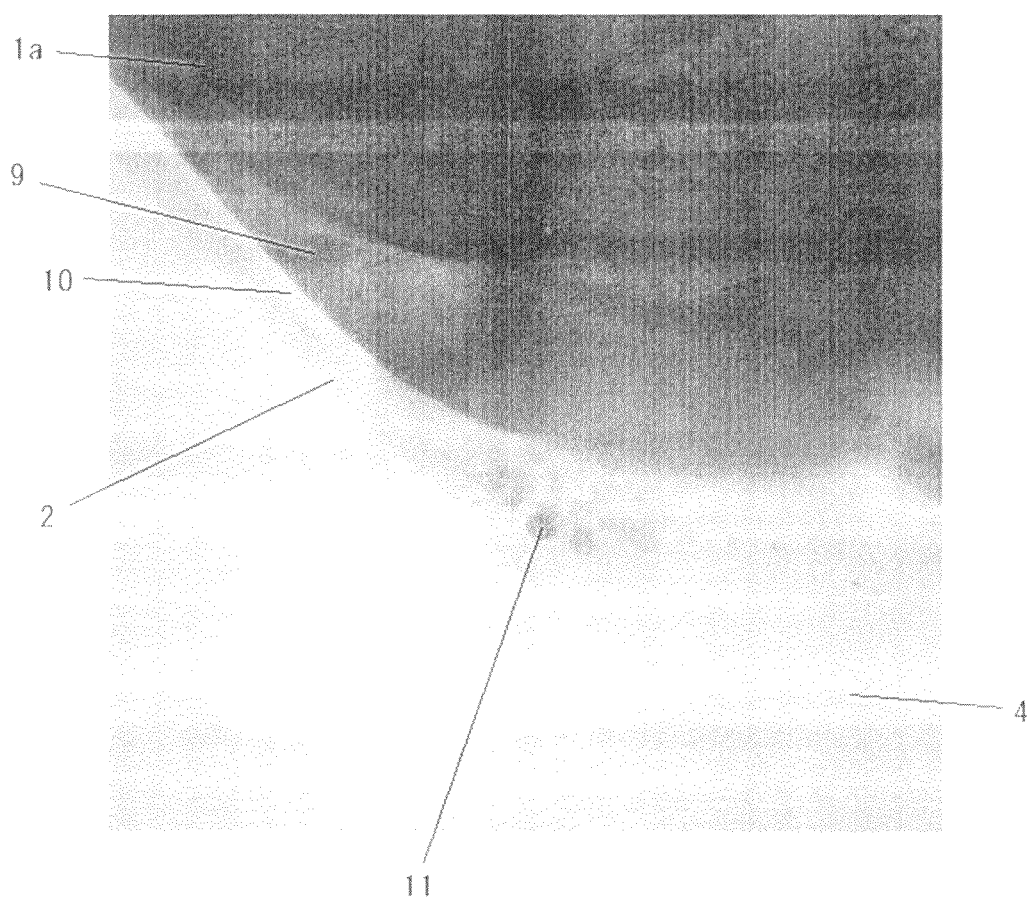
FIG. 3 is a TEM photograph of the interface between a substrate and a front electrode using the Te glass of the present invention.

FIG. 3 shows the interface between a silicon substrate and a front electrode formed using the conductive paste of the present invention as observed under a transmission electron microscope (TEM). A unique structure is formed in which a Te glass layer 9 comprising a silver component and a silicon oxide layer 10 with a series of precipitated fine silver particles 11 are present between a front electrode layer 1a and a SiN layer 2. The inventors assume that this is due to the low reactivity of Te glass with silicon oxide and the property of Te glass of dissolving silver very easily in solid solution. Due to the properties of Te glass, it is believed that large quantities of silver is dissolved as ions in the Te glass during firing when the electrode is formed and the silver ions thus dissolved in the glass subsequently diffuse gradually into the SiN layer 2 via the glass layer, promoting an oxidation-reduction reaction that converts part of the surface layer of the SiN layer into silicon oxide at the interface with the electrode, while precipitating as very fine silver particles. Further, since there is no deep penetration into the silicon substrate 4 even when the electrode does break through the antireflective film, the conductive paste of the present invention has a low dependence on firing temperature compared with conventional conductive paste and allow for an easy fire-through control and further reduction in the thickness of the solar cell and further reduction in the thickness of the n-type diffusion layer, which are expected to be needed in the future, can be achieved.

In the Te glass of the present invention tellurium oxide is a network-forming component that forms the network of the glass, and it is also desirable to include one or more of tungsten oxide and molybdenum oxide as a component that assists in glass network formation in addition to tellurium oxide.

Tungsten oxide and molybdenum oxide both contribute to expanding the vitrification range of the Te glass and stabilizing the glass. Vitrification is difficult if the combined content of these components as oxides is less than 5 mol % or more than 60 mol %. The preferred range is 10 to 50 mol %.

One or more of zinc, bismuth and aluminum are preferably included in the Te glass of the present invention, and it is especially desirable to include these in combination with tungsten and/or molybdenum.

Zinc helps to expand the vitrification range and stabilize the glass, but vitrification becomes difficult if the content thereof as an oxide exceeds 50 mol %. The preferred range is 5 to 30 mol %.

Bismuth helps to expand the vitrification range And improve chemical durability, but a crystal phase is likely to form if the content thereof as an oxide exceeds 25 mol %, detracting from the stability of the glass. The preferred range is 0.5 to 22 mol %.

Aluminum helps to improve the chemical durability of the glass, but when the addition thereof as oxide is above 25 mol %, a significant effect by the addition cannot be obtained. The preferred range is 2 to 20 mol %.

In addition, the alkali metal elements such as lithium and sodium, the alkali earth metal elements such as magnesium, calcium, strontium and barium and the other elements such as dysprosium, yttrium, niobium, lanthanum, silver, zirconium, titanium, boron, germanium, phosphorus and tantalum can be included alone or in combination thereof in the Te glass of the present invention in order to adjust reactivity with the SiN layer and the solid dissolution amount of silver, and the total content of these as oxides is preferably 50 mol % or less.

Further, the Te glass of the present invention preferably has a softening point of 300 to 550° C. If the softening point is below 300° C. fire-through occurs more easily, and the front electrode may penetrate through not only the SiN layer but also the n-type diffusion layer, increasing the risk of breaking the p-n junction. If the softening point exceeds 550° C., insufficient glass is supplied to the junction interface between the front electrode and the antireflective film, so that the aforementioned unique structure is not obtained, ohmic contact is impaired, and the adhesive strength of the electrode is diminished.

In addition to the aforementioned Te glass frit, glass frit other than the Te glass can be combined in the conductive paste of the present invention. For purposes of controlling the firing temperature, reactivity to the SiN layer and the like and controlling the characteristics of the resulting solar cell device, glass chosen from among known glasses such as $SiO_2$—$B_2O_3$ glass, $SiO_2$—$B_2O_3$—ZnO glass, $SiO_2$—$Bi_2O_3$ glass, $B_2O_3$—ZnO glass, etc. can be combined with the Te glass as appropriate as the glass frit other than the Te glass, and it is especially desirable to include $SiO_2$—$B_2O_3$ glass or $SiO_2$—$B_2O_3$—ZnO glass.

The glass frit in the conductive paste of the present invention can be contained in an amount normally contained in conductive paste for forming solar cell electrodes, but for example 0.1 to 10 parts by weight per 100 parts by weight of conductive powder is preferred. If the amount of glass frit is less than 0.1 parts by weight per 100 parts by weight of conductive powder, adhesiveness and electrode strength will be very low. If it exceeds 10 parts by weight, on the other hand, there will be problems with glass float on the electrode surface and increased contact resistance due to glass flowing into the interface. In conventional conductive pastes for forming solar cell electrodes, a certain amount of glass frit must be added in order to achieve good fire-through. However, in the conductive paste of the present invention even when the amount of glass frit is suppressed, sufficient ohmic contact can be achieved. A more desirable amount of glass frit is 0.1 to 5 parts by weight per 100 parts by weight of conductive powder.

The average particle size of the glass frit added in the conductive paste of the present invention is not particularly limited but is preferably 0.5 to 5.0 μm.

The conductive paste of the present invention essentially contains no lead component, and specifically the lead content of the conductive paste is 1000 ppm or less.

One or more of plasticizers, viscosity adjusters, surfactants, oxidizers, metal oxides, organic metal compounds and the like commonly used as additives can be added as necessary in the conductive paste of the present invention to the extent that they do not detract from the effects of the present invention. The silver compound such as silver carbonate, silver oxide or silver acetate described in Japanese Patent Publication No. 2007-242912 A filed by the applicant can also be added, and one or more of copper oxide, zinc oxide, titanium oxide and the like can also be added appropriately in order to control the firing temperature, improve solar cell characteristics and the like.

The conductive paste of the present invention is formed by mixing the aforementioned conductive powder, glass frit and appropriate additives together with an organic vehicle to obtain a paste, paint or ink with a rheology suited to screen printing or other printing method. The organic vehicle is not particularly limited, and an organic binder, solvent, etc. commonly used as a vehicle in silver paste can be selected and mixed as appropriate. Examples of organic binders include celluloses, acrylic resins, phenol resins, alkyd resins, rosin esters and the like, while examples of solvents include alcohols, ethers, esters, hydrocarbons and other organic solvents as well as water and mixed solvents of these. The amount of the organic vehicle is not particularly limited, and can be adjusted appropriately according to the application method to an amount suitable for retaining inorganic components such as the conductive powder and the glass frit in a paste, but is normally about 5 to 40 parts by weight per 100 parts by weight of the conductive powder.

The solar cell device in which the conductive paste of the present invention is used is manufactured for example as follows.

The semiconductor substrate is preferably of monocrystalline silicon or polycrystalline silicon, doped with boron or the like so that the substrate exhibits one conductivity type (p-type for example). A diffusion layer is formed by diffusing phosphorus atoms or the like into the semiconductor substrate from the light-receiving surface thereof, thereby forming a region exhibiting the opposite conductivity type (n-type for example), on which is provided an antireflective film of silicon nitride or the like. An aluminum paste, silver paste or silver-aluminum paste is applied onto the substrate surface opposite the light-receiving surface and dried to form a rear electrode and a high-concentration p-type BSF layer. The conductive paste of the present invention is then applied onto the aforementioned antireflective film by a conventional method such as screen printing, dried and fired for a total firing time of about 1 to 30 minutes at a peak temperature of 500 to 900° C. to decompose and remove the organic vehicle components and simultaneously form the front electrode, rear electrode and BSF layer. The front electrode and rear electrode do not have to be co-fired, and the front electrode can be formed after the rear electrode is fired, or the rear electrode can be formed after the front electrode is fired. The light-receiving surface of the semiconductor substrate preferably has a textured structure with a concave-convex surface (or pyramid-like asperities) in order to obtain better photoelectric conversion efficiency.

EXAMPLES

The present invention is explained in detail below by means of examples, but the present invention is not limited thereby.

1. Preliminary Test

Preparation of Samples 1 to 11

100 parts by weight of silver powder and 2 parts by weight of glass frit having the compositions shown in Table 1 were dispersed together in an organic vehicle composed of 1.6 parts by weight of ethyl cellulose and 6.4 parts by weight of butyl carbitol, to prepare conductive pastes (Samples 1 to 11). The ingredients in the glass compositions shown in the table are all given in mol % as oxides.

The powders listed in the "silver powder" columns in the table are as follows. The average particle size D50 shown below corresponds to a weight-based cumulative 50% value in particle size distribution as measured with a laser diffraction particle size analyzer.

Silver powder X: Spherical powder,
  average particle size D50=1.8 μm
Silver powder Y: Spherical powder,
  average particle size D50=1.5 μm
Silver powder Z: Spherical powder,
  average particle size D50=2.6 μm Electrode Formation and Evaluation For initial evaluation of the conductive pastes thus prepared, contact resistance was measured as follows by the TLM (transmission line model) method.

First, 10 of 2 cm×2 cm square-shaped p-type silicon substrates with a pyramidal texture formed by alkali etching were prepared for each sample, phosphorus was diffused into each substrate from one principal surface (light-receiving surface) to form an n-type region (diffusion layer), and an SiN layer was formed thereon by plasma CVD to an average thickness of 75 nm.

Next, a plurality of front electrodes in the form of fine line 100 μm wide and 15 μm thick were formed on the SiN layer with a pitch of 2 mm between the line-shaped electrode, using Samples 1 to 11 prepared above, the resistance value between the line-shaped electrodes was measured with a digital multimeter (3458A Multimeter made by Hewlett Packard Co.), and the contact resistance was determined and used to evaluate the samples.

Note that the front electrodes were fired at a peak temperature of 800° C.

The results are shown together in Table 1. The symbols used in the "contact resistance" columns in the table are as follows.

◎ Average contact resistance for 10 substrates is less than 0.05 Ω·cm$^2$

○ Average contact resistance for 10 substrates is at least 0.05 Ω·cm$^2$ but less than 0.08 Ωcm$^2$ Δ Average contact resistance for 10 substrates is at least 0.08 Ωcm$^2$ but less than 0.10 Ωcm$^2$ X Average contact resistance for 10 substrates is 0.10 Ωcm$^2$ or more Next, the interface between the front electrode and the silicon substrate was observed in a TEM photograph, as described above, and penetration by the front electrode through the SiN layer into the silicon substrate was evaluated as follows. The results are shown in the "penetration" column in the table.

A: Maximum penetration through the SiN layer into the silicon substrate is less than 100 nm.

B: Maximum penetration is at least 100 nm but less than 200 nm.

C: Maximum penetration is at least 200 nm but less than 300 nm.

D: Maximum penetration is 300 nm or more.

As discussed above, when the Te glass is used for the glass frit in the conductive paste, generally good contact resistance is obtained as shown in Table 1

TABLE 1

| Sample | Ag powder | Glass composition | | | | Penetration | Contact resistance |
| --- | --- | --- | --- | --- | --- | --- | --- |
| | | Te | W | Mo | Bi | | |
| 1 | X | 40.0 | | 50.0 | 10.0 | A | ○ |
| 2 | X | 50.0 | | 40.0 | 10.0 | A | ○ |
| 3 | X | 60.0 | | 20.0 | 20.0 | A | ◎ |
| 4 | X | 60.0 | | 25.0 | 15.0 | A | ○ |
| 5 | X | 60.0 | | 30.0 | 10.0 | A | ◎ |
| 6 | X | 70.0 | | 20.0 | 10.0 | B | ○ |
| 7 | X | 50.0 | 40.0 | | 10.0 | A | ◎ |
| 8 | X | 60.0 | 20.0 | | 20.0 | A | ◎ |
| 9 | X | 60.0 | 30.0 | | 10.0 | A | ◎ |
| 10 | X | 60.0 | 35.0 | | 5.0 | A | ◎ |
| 11 | X | 70.0 | 20.0 | | 10.0 | B | ○ |

Evaluation of Samples 12-81

Samples 12 to 81 were prepared as in Samples 1 to 11 except that the glass compositions and silver powders contained in the conductive pastes were changed as given in Table 2-1 and Table 2-2 and their contact resistances were measured and evaluated as in Samples 1 to 11. The results are shown in Table 2-1 and Table 2-2. The respective ingredients of the glass compositions are all given in mol % as oxides in the tables.

TABLE 2-1

| Sample | Ag powder | Glass composition | | | | | | | | | | | | |
|---|---|---|---|---|---|---|---|---|---|---|---|---|---|---|
| | | Te | W | Zn | Mo | Bi | Al | Ag | B | Zr | P | Ti | Li | Mg |
| 12 | X | 66.7 | 28.5 | | | | | | 4.8 | | | | | |
| 13 | X | 50.0 | 25.0 | | | | | | | | | | 25.0 | |
| 14 | X | 50.0 | 25.0 | | | | | | | | | | | 25.0 |
| 15 | X | 50.0 | 25.0 | | | | | | | 25.0 | | | | |
| 16 | X | 60.0 | 30.0 | | | | | | | | | | | |
| 17 | X | 70.0 | 20.0 | | | | | | | | | | | |
| 18 | X | 50.0 | 25.0 | | | | | | | | | | | |
| 19 | X | 60.0 | 30.0 | | | | | | | | | | | |
| 20 | X | 70.0 | 20.0 | | | | | | | | | | | |
| 21 | X | 60.0 | 30.0 | | | | | | | | | | | |
| 22 | X | 70.0 | 20.0 | | | | | | | | | | | |
| 23 | X | 50.0 | 25.0 | | | | | | | | | | | |
| 24 | X | 70.0 | | | 20.0 | | | | | | | | | |
| 25 | X | 50.0 | | 25.0 | | | | | | | | | | |
| 26 | Y | 40.0 | 20.0 | | | 6.7 | | 33.3 | | | | | | |
| 27 | X | 50.0 | 40.0 | | | 10.0 | | | | | | | | |
| 28 | Y | 50.0 | 25.0 | | | 8.3 | | | | 16.7 | | | | |
| 29 | Y | 54.5 | 27.3 | | | 9.1 | 9.1 | | | | | | | |
| 30 | Y | 54.5 | 27.3 | | | 9.1 | | | 9.1 | | | | | |
| 31 | Y | 54.5 | 27.3 | | | 9.1 | | | | 9.1 | | | | |
| 32 | X | 55.8 | 32.5 | | | 4.7 | | | | 2.3 | 4.7 | | | |
| 33 | Y | 55.8 | 27.9 | | | 9.3 | 7.0 | | | | | | | |
| 34 | Y | 57.1 | 28.6 | | | 9.5 | 4.8 | | | | | | | |
| 35 | Y | 57.1 | 28.6 | | | 9.5 | | | 4.8 | | | | | |
| 36 | Y | 57.1 | 28.6 | | | 9.5 | | | | 4.8 | | | | |
| 37 | Y | 58.0 | 29.0 | | | 9.6 | 3.4 | | | | | | | |
| 38 | Y | 58.3 | 29.1 | | | 9.7 | | | | | | | | |
| 39 | Y | 58.5 | 29.3 | | | 9.8 | 2.4 | | | | | | | |
| 40 | Y | 58.5 | 29.3 | | | 9.8 | | | 2.4 | | | | | |
| 41 | Y | 58.5 | 29.3 | | | 9.8 | | | | 2.4 | | | | |
| 42 | Y | 58.8 | 29.4 | | | 9.8 | | | | | | | | |
| 43 | X | 60.0 | 25.0 | | | 15.0 | | | | | | | | |
| 44 | Y | 60.0 | 25.0 | | | 15.0 | | | | | | | | |
| 45 | X | 60.0 | 30.0 | | | 10.0 | | | | | | | | |
| 46 | Y | 60.0 | 30.0 | | | 10.0 | | | | | | | | |
| 47 | X | 65.1 | 18.6 | | | 9.3 | | | | 2.3 | 4.7 | | | |

| Sample | Glass composition | | | | | | | | | Penetration | Contact resistance |
|---|---|---|---|---|---|---|---|---|---|---|---|
| | Ta | Nb | Ba | La | Dy | Y | Si | Cu | Pb | | |
| 12 | | | | | | | | | | B | ○ |
| 13 | | | | | | | | | | A | ○ |
| 14 | | | | | | | | | | A | ○ |
| 15 | | | | | | | | | | B | ○ |
| 16 | | | | | 10.0 | | | | | A | ○ |
| 17 | | | | | | 10.0 | | | | B | ○ |
| 18 | 25.0 | | | | | | | | | A | ○ |
| 19 | | | | 10.0 | | | | | | A | ○ |
| 20 | | | | 10.0 | | | | | | B | ○ |
| 21 | | | | | 10.0 | | | | | A | ○ |
| 22 | | | | | | 10.0 | | | | B | ○ |
| 23 | | 25.0 | | | | | | | | A | ○ |
| 24 | | | | 10.0 | | | | | | B | ○ |
| 25 | | | | 25.0 | | | | | | A | ○ |
| 26 | | | | | | | | | | B | ◉ |
| 27 | | | | | | | | | | A | ○ |
| 28 | | | | | | | | | | B | ◉ |
| 29 | | | | | | | | | | A | ◉ |
| 30 | | | | | | | | | | B | ○ |
| 31 | | | | | | | | | | B | ○ |
| 32 | | | | | | | | | | B | ○ |
| 33 | | | | | | | | | | A | ○ |
| 34 | | | | | | | | | | A | ○ |
| 35 | | | | | | | | | | B | ◉ |
| 36 | | | | | | | | | | B | ○ |
| 37 | | | | | | | | | | A | ○ |
| 38 | | | | | | | 2.9 | | | B | ◉ |
| 39 | | | | | | | | | | A | ◉ |
| 40 | | | | | | | | | | A | ◉ |
| 41 | | | | | | | | | | B | ◉ |
| 42 | | | | | | | | 2.0 | | B | ◉ |
| 43 | | | | | | | | | | A | ◉ |
| 44 | | | | | | | | | | A | ○ |
| 45 | | | | | | | | | | A | ○ |

TABLE 2-1-continued

| 46 | | | | | | | | | | | | | | | | | | | | | | | A | ◎ |
| 47 | | | | | | | | | | | | | | | | | | | | | | | B | ◎ |

TABLE 2-2

| Sample | Ag powder | Glass composition ||||||||||||||||||||| Penetration | Contact resistance |
|---|---|---|---|---|---|---|---|---|---|---|---|---|---|---|---|---|---|---|---|---|---|---|---|---|
| | | Te | W | Zn | Mo | Bi | Al | Ag | B | Zr | P | Ti | Li | Mg | Ta | Nb | Ba | La | Dy | Y | Si | Cu | Pb | | |
| 48 | Y | 65.1 | 23.2 | | | 4.7 | | | 2.3 | 4.7 | | | | | | | | | | | | | | B | ○ |
| 49 | X | 68.3 | 19.5 | | | 9.8 | | | 2.4 | | | | | | | | | | | | | | | B | ○ |
| 50 | Y | 40.0 | | | 20.0 | 6.7 | | 33.3 | | | | | | | | | | | | | | | | B | ◎ |
| 51 | Y | 46.7 | | | 13.3 | 6.7 | | 33.3 | | | | | | | | | | | | | | | | B | ◎ |
| 52 | X | 55.8 | | | 27.9 | 9.3 | | | 2.3 | 4.7 | | | | | | | | | | | | | | B | ◎ |
| 53 | Y | 55.8 | | | 27.9 | 9.3 | | | 2.3 | 4.7 | | | | | | | | | | | | | | B | ◎ |
| 54 | Y | 58.3 | | | 16.7 | 8.3 | | 16.7 | | | | | | | | | | | | | | | | B | ◎ |
| 55 | Y | 60.0 | | | 30.0 | 10.0 | | | | | | | | | | | | | | | | | | A | ◎ |
| 56 | Y | 63.6 | | | 18.2 | 9.1 | | 9.1 | | | | | | | | | | | | | | | | B | ○ |
| 57 | Y | 40.0 | 20.0 | 20.0 | 20.0 | | | | | | | | | | | | | | | | | | | A | ○ |
| 58 | Y | 50.0 | 30.0 | 10.0 | | 10.0 | | | | | | | | | | | | | | | | | | B | ◎ |
| 59 | Y | 60.0 | 20.0 | 10.0 | | 10.0 | | | | | | | | | | | | | | | | | | B | ○ |
| 60 | Y | 60.0 | 25.0 | 5.0 | | 10.0 | | | | | | | | | | | | | | | | | | B | ○ |
| 61 | Y | 31.7 | 15.9 | 15.9 | | | | 31.7 | 1.6 | 3.2 | | | | | | | | | | | | | | B | ◎ |
| 62 | Y | 33.3 | 16.7 | 16.7 | | | | 33.3 | | | | | | | | | | | | | | | | B | ○ |
| 63 | Y | 37.2 | 37.2 | 18.6 | | | | | 2.3 | 4.7 | | | | | | | | | | | | | | B | ○ |
| 64 | Y | 41.7 | 20.8 | 20.8 | | | | 16.7 | | | | | | | | | | | | | | | | B | ◎ |
| 65 | Y | 41.8 | 32.6 | 18.6 | | | | | 2.3 | 4.7 | | | | | | | | | | | | | | B | ◎ |
| 66 | X | 44.5 | 22.2 | 22.2 | | 4.4 | | | 2.3 | 4.4 | | | | | | | | | | | | | | B | ○ |
| 67 | X | 45.3 | 22.6 | 22.6 | | 2.7 | | | 2.3 | 4.5 | | | | | | | | | | | | | | B | ○ |
| 68 | X | 45.5 | 22.7 | 22.7 | | | | | | | | | | | | | | | | | 9.1 | | | B | ◎ |
| 69 | Y | 45.5 | 22.7 | 22.7 | | | | 9.1 | | | | | | | | | | | | | | | | A | ◎ |
| 70 | X | 45.5 | 22.7 | 22.7 | | | | | | | | 9.1 | | | | | | | | | | | | B | ◎ |
| 71 | X | 45.5 | 22.7 | 22.7 | | | | | | | | | 9.1 | | | | | | | | | | | B | ◎ |
| 72 | X | 47.6 | 23.8 | 23.8 | | | | | | | | | | 4.8 | | | | | | | | | | B | ◎ |
| 73 | X | 48.8 | 24.4 | 24.4 | | | | | | | | | | | 2.4 | | | | | | | | | B | ◎ |
| 74 | X | 46.2 | 23.0 | 23.0 | | 0.9 | | | 2.3 | 4.6 | | | | | | | | | | | | | | B | ○ |
| 75 | X | 46.4 | 23.3 | 23.3 | | | | | 2.3 | 4.7 | | | | | | | | | | | | | | B | ◎ |
| 76 | Y | 46.5 | 37.2 | 9.3 | | | | | 2.3 | 4.7 | | | | | | | | | | | | | | B | ○ |
| 77 | X | 47.6 | 23.8 | 23.8 | | | | | | | | | | | | | | | | | | 4.8 | | A | ○ |
| 78 | X | 50.0 | 25.0 | 25.0 | | | | | | | | | | | | | | | | | | | | A | ◎ |
| 79 | Y | 50.0 | 25.0 | 25.0 | | | | | | | | | | | | | | | | | | | | A | ◎ |
| 80 | Z | 50.0 | 25.0 | 25.0 | | | | | | | | | | | | | | | | | | | | A | ◎ |
| 81 | Y | 51.1 | 32.6 | 9.3 | | | | | 2.3 | 4.7 | | | | | | | | | | | | | | B | ◎ |

Evaluation of Samples 82-130

Samples 82 to 130 were prepared as in Samples 1 to 11 except that the glass compositions and silver powders contained in the conductive pastes and the part(s) (by weight) of the glass added to the conductive pastes were changed as given in Table 3-1 and Table 3-2 and their contact resistances were measured and evaluated as in Samples 1 to 11. The results are shown in Table 3-1 and Table 3-2.

Evaluation of Comparative Samples 1-2

As Comparative Samples 1 and 2, conductive pastes were prepared as in Samples 1 to 11 except that the compositions and amounts of the added glass frits and the used silver powders were changed as given in Table 3-2 and their contact resistances were measured and evaluated as described above. The results are shown in Table 3-2.

In Tables 3-1 and 3-2, the part or parts of glass are given part or parts by weight per 100 parts by weight of silver powder and the respective ingredients of the glass compositions are all given in mol % as oxides.

TABLE 3-1

| Sample | Ag powder | Glass part(s) by weight | Glass composition |||||||||||
|---|---|---|---|---|---|---|---|---|---|---|---|---|---|
| | | | Te | W | Zn | Mo | Bi | Al | Ag | B | Zr | P | Ti | Li |
| 82 | X | 0.5 part | 46.4 | 23.3 | 23.3 | | | | | 2.3 | 4.7 | | | |
| 83 | Y | 2.5 parts | 46.4 | 23.3 | 23.3 | | | | | 2.3 | 4.7 | | | |
| 84 | Z | 2.5 parts | 46.4 | 23.3 | 23.3 | | | | | 2.3 | 4.7 | | | |
| 85 | X | 1.5 parts | 50.0 | 25.0 | 25.0 | | | | | | | | | |
| 86 | Y | 1.5 parts | 50.0 | 25.0 | 25.0 | | | | | | | | | |
| 87 | Z | 1.5 parts | 50.0 | 25.0 | 25.0 | | | | | | | | | |
| 88 | Y | 3 parts | 50.0 | 25.0 | 25.0 | | | | | | | | | |
| 89 | Y | 1 part | 40.0 | 20.0 | | 6.7 | | | 33.3 | | | | | |
| 90 | Y | 1 part | 50.0 | 25.0 | | 8.3 | | | 16.7 | | | | | |

TABLE 3-1-continued

| Sample | Ag powder | Glass part(s) by weight | Te | W | Zn | Mo | Bi | Al | Ag | B | Zr | P | Ti | Li |
|---|---|---|---|---|---|---|---|---|---|---|---|---|---|---|
| 91 | Y | 1 part | 54.5 | 27.3 | | | 9.1 | | 9.1 | | | | | |
| 92 | Y | 1 part | 54.5 | 27.3 | | 9.1 | 9.1 | | | | | | | |
| 93 | Y | 1.5 parts | 54.5 | 27.3 | | | 9.1 | | | | | | | 9.1 |
| 94 | Y | 1.5 parts | 54.5 | 27.3 | | | 9.1 | 9.1 | | | | | | |
| 95 | Y | 1.5 parts | 54.5 | 27.3 | | | 9.1 | | | | | | | |
| 96 | Y | 1 part | 57.1 | 28.6 | | | 9.5 | | | | 4.8 | | | |
| 97 | Y | 1 part | 57.1 | 28.6 | | | 9.5 | | | | | 4.8 | | |
| 98 | Y | 1 part | 57.1 | 28.6 | | | 9.5 | 4.8 | | | | | | |
| 99 | Y | 1.5 parts | 57.1 | 28.6 | | | 9.5 | | | | | | | 4.8 |
| 100 | Y | 1.5 parts | 57.1 | 28.6 | | | 9.5 | | | | | | 4.8 | |
| 101 | Y | 1.5 parts | 57.1 | 28.6 | | | 9.5 | | 4.8 | | | | | |
| 102 | Y | 1.5 parts | 57.1 | 28.6 | | | 9.5 | | | | 4.8 | | | |
| 103 | Y | 1.5 parts | 57.1 | 28.6 | | | 9.5 | 4.8 | | | | | | |
| 104 | Y | 1.5 parts | 57.1 | 28.6 | | | 9.5 | | | | | | | |
| 105 | Y | 1.5 parts | 58.3 | 29.1 | | | 9.7 | | | | | | | |
| 106 | Y | 1.5 parts | 58.3 | 29.1 | | | 9.7 | | | | | | | |
| 107 | Y | 1 part | 58.5 | 29.3 | | | 9.8 | | | 2.4 | | | | |

| Sample | Mg | Ta | Nb | Ba | La | Dy | Y | Si | Cu | Pb | Penetration | Contact resistance |
|---|---|---|---|---|---|---|---|---|---|---|---|---|
| 82 | | | | | | | | | | | B | ○ |
| 83 | | | | | | | | | | | A | ⊚ |
| 84 | | | | | | | | | | | A | ⊚ |
| 85 | | | | | | | | | | | A | ○ |
| 86 | | | | | | | | | | | A | ⊚ |
| 87 | | | | | | | | | | | A | ⊚ |
| 88 | | | | | | | | | | | A | ⊚ |
| 89 | | | | | | | | | | | B | ⊚ |
| 90 | | | | | | | | | | | B | ○ |
| 91 | | | | | | | | | | | B | ○ |
| 92 | | | | | | | | | | | B | ○ |
| 93 | | | | | | | | | | | A | ⊚ |
| 94 | | | | | | | | | | | A | ⊚ |
| 95 | | | | | | | | 9.1 | | | B | ○ |
| 96 | | | | | | | | | | | B | ⊚ |
| 97 | | | | | | | | | | | B | ⊚ |
| 98 | | | | | | | | | | | B | ○ |
| 99 | | | | | | | | | | | A | ○ |
| 100 | | | | | | | | | | | B | ○ |
| 101 | | | | | | | | | | | B | ○ |
| 102 | | | | | | | | | | | B | ⊚ |
| 103 | | | | | | | | | | | A | ○ |
| 104 | | | | | | | | 4.8 | | | B | ○ |
| 105 | | 2.9 | | | | | | | | | A | ⊚ |
| 106 | | | | | | 2.9 | | | | | B | ⊚ |
| 107 | | | | | | | | | | | B | ⊚ |

TABLE 3-2

| Sample | Ag powder | Glass part(s) by weight | Te | W | Zn | Mo | Bi | Al | Ag | B | Zr | P | Ti | Li |
|---|---|---|---|---|---|---|---|---|---|---|---|---|---|---|
| 108 | Y | 1 part | 58.5 | 29.3 | | | 9.8 | | | 2.4 | | | | |
| 109 | Y | 1 part | 58.5 | 29.3 | | | 9.8 | | | | 2.4 | | | |
| 110 | Y | 1.5 parts | 58.5 | 29.3 | | | 9.8 | 2.4 | | | | | | |
| 111 | Y | 1.5 parts | 58.5 | 29.3 | | | 9.8 | | | 2.4 | | | | |
| 112 | Y | 1.5 parts | 58.5 | 29.3 | | | 9.8 | | 2.4 | | | | | |
| 113 | Y | 1.5 parts | 59.4 | 29.7 | | | 9.9 | | | | | | | |
| 114 | Y | 1.5 parts | 59.4 | 29.7 | | | 9.9 | | | | | | | |
| 115 | Y | 1.5 parts | 59.4 | 29.7 | | | 9.9 | | | | | | | 1.0 |
| 116 | Y | 1.5 parts | 59.4 | 29.7 | | | 9.9 | | | | | | | |
| 117 | Y | 1.5 parts | 59.6 | 29.9 | | | 10.0 | | | | | | | |
| 118 | Y | 1.5 parts | 59.6 | 29.9 | | | 10.0 | | | | | | | |
| 119 | X | 1 part | 60.0 | 30.0 | | | 10.0 | | | | | | | |
| 120 | X | 1.5 parts | 60.0 | 30.0 | | | 10.0 | | | | | | | |
| 121 | Y | 1 part | 60.0 | 30.0 | | | 10.0 | | | | | | | |
| 122 | Y | 1.5 parts | 60.0 | 30.0 | | | 10.0 | | | | | | | |
| 123 | Y | 1 part | 60.0 | 25.0 | | | 15.0 | | | | | | | |
| 124 | Y | 1.5 parts | 60.0 | 25.0 | | | 15.0 | | | | | | | |
| 125 | Y | 1.5 parts | 40.0 | 20.0 | | | 6.7 | | | | 33.3 | | | |

TABLE 3-2-continued

| Sample | Ag powder | Glass parts by weight | Te | W | Zn | Bi | B | Si | Pb |
|---|---|---|---|---|---|---|---|---|---|
| 126 | Y | 1.5 parts | 50.0 | 25.0 | | | 8.3 | 16.7 | |
| 127 | X | 1 part | 60.0 | | | 30.0 | 10.0 | | |
| 128 | X | 1.5 parts | 60.0 | | | 30.0 | 10.0 | | |
| 129 | Y | 1 part | 60.0 | | | 30.0 | 10.0 | | |
| 130 | Y | 1.5 parts | 60.0 | | | 30.0 | 10.0 | | |
| Comp. Sample 1 | Y | 3 parts | | | | | | | 2.0 |
| Comp. Sample 2 | Y | 2 parts | | | 20.0 | | | 60.0 | |

| Sample | Glass composition | | | | | | | | | | Penetration | Contact resistance |
|---|---|---|---|---|---|---|---|---|---|---|---|---|
| | Mg | Ta | Nb | Ba | La | Dy | Y | Si | Cu | Pb | | |
| 108 | | | | | | | | | | | B | ⊚ |
| 109 | | | | | | | | | | | B | ⊚ |
| 110 | | | | | | | | | | | A | ⊚ |
| 111 | | | | | | | | | | | B | ⊚ |
| 112 | | | | | | | | | | | B | ⊚ |
| 113 | | | | | | | | | | 1.0 | | B | ⊚ |
| 114 | | 1.0 | | | | | | | | | A | ⊚ |
| 115 | | | | | | | | | | | B | ○ |
| 116 | | | | | | | | | 1.0 | | A | ⊚ |
| 117 | | | | | 0.5 | | | | | | A | ○ |
| 118 | | | 0.5 | | | | | | | | A | ⊚ |
| 119 | | | | | | | | | | | B | ⊚ |
| 120 | | | | | | | | | | | A | ○ |
| 121 | | | | | | | | | | | B | ⊚ |
| 122 | | | | | | | | | | | A | ⊚ |
| 123 | | | | | | | | | | | B | ⊚ |
| 124 | | | | | | | | | | | A | ⊚ |
| 125 | | | | | | | | | | | B | ⊚ |
| 126 | | | | | | | | | | | B | ⊚ |
| 127 | | | | | | | | | | | B | ⊚ |
| 128 | | | | | | | | | | | A | ⊚ |
| 129 | | | | | | | | | | | B | ⊚ |
| 130 | | | | | | | | | | | A | ⊚ |
| Comp. Sample 1 | | | | | | | | 38.0 | | 60.0 | C | ⊚ |
| Comp. Sample 2 | | | | | | | | 20.0 | | | D | Δ |

As clear from the above tables, the electrodes formed using the conductive pastes of the present invention provided a low contact resistance therebetween, without causing penetration through the SiN layer by the electrode layer and deep penetration into the silicon substrate. In the case of the front electrodes formed by the comparative samples, it was confirmed that part of the electrodes penetrated through the SiN layer and intruded deeply into the semiconductor substrate.

2. Evaluation of Solar Cell Device Characteristics

As in the preliminary test, an n-type diffusion layer and a SiN layer were formed in that order on one principal surface (light-receiving surface) of a 2 cm×2 cm p-type silicon substrate with a pyramidal textured structure formed by alkali etching, and a rear electrode was formed with an aluminum paste onto the rear surface of the substrate on the opposite side, after which a comb-shaped pattern was printed on the SiN layer using each of the aforementioned Samples 44, 79, 88 and 123 so as to obtain a comb-shaped front electrode (line width: 100 μm, thickness: 15 μm, pitch between lines: 2 mm) after firing, and was fired at a peak temperature of 800° C. to form the front electrode and prepare a solar cell device. The same samples were also used to form comb-shaped patterns which were fired at peak temperatures of 760° C. and 780° C. to prepare solar cell devices different only in terms of firing temperature.

Comb-shaped patterns were also formed with Comparative Samples 1 and 2, and fired at a peak temperature of 800° C. to prepare solar cell devices.

The resulting solar cell devices were subjected to I-V curve measurement using a solar simulator (WXS-50S-1.5, AM 1.5 G made by WACOM ELECTRIC Co., Ltd.) and high-current source meter (Model 2400 made by KEITHLEY INSTRUMENTS, INC.) to determine the open circuit voltage (Voc), short-circuit current density (Jsc), fill factor (FF), maximum power output (Pmax) and conversion efficiency (Eff), with the results shown in Table 4.

TABLE 4

| Sample | Ag powder | Glass part(s) by weight | Glass composition | | | | | | | Firing temperature | Voc [V] | Jsc [mA·cm$^{-2}$] | FF | Pmax [mW] | Eff [%] |
|---|---|---|---|---|---|---|---|---|---|---|---|---|---|---|---|
| | | | Te | W | Zn | Bi | B | Si | Pb | | | | | | |
| 44 | Y | 2 parts | 60.0 | 25.0 | 15.0 | | | | | 760° C. | 0.608 | 34.83 | 0.727 | 61.61 | 15.40 |
| | | | | | | | | | | 780° C. | 0.603 | 34.19 | 0.717 | 59.11 | 14.78 |
| | | | | | | | | | | 800° C. | 0.594 | 30.37 | 0.724 | 52.26 | 13.07 |

TABLE 4-continued

| Sample | Ag powder | Glass part(s) by weight | Te | W | Zn | Bi | B | Si | Pb | Firing temperature | Voc [V] | Jsc [mA·cm$^{-2}$] | FF | Pmax [mW] | Eff [%] |
|---|---|---|---|---|---|---|---|---|---|---|---|---|---|---|---|
| 123 | Y | 1 part | 60.0 | 25.0 |  | 15.0 |  |  |  | 760° C. | 0.604 | 32.39 | 0.758 | 59.31 | 14.83 |
|  |  |  |  |  |  |  |  |  |  | 780° C. | 0.600 | 31.98 | 0.763 | 58.53 | 14.63 |
|  |  |  |  |  |  |  |  |  |  | 800° C. | 0.600 | 32.35 | 0.761 | 59.10 | 14.77 |
| 79 | Y | 2 parts | 50.0 | 25.0 | 25.0 |  |  |  |  | 760° C. | 0.605 | 32.58 | 0.766 | 60.38 | 15.10 |
|  |  |  |  |  |  |  |  |  |  | 780° C. | 0.603 | 32.30 | 0.776 | 60.46 | 15.11 |
|  |  |  |  |  |  |  |  |  |  | 800° C. | 0.605 | 31.57 | 0.774 | 59.14 | 14.78 |
| 88 | Y | 3 parts | 50.0 | 25.0 | 25.0 |  |  |  |  | 760° C. | 0.603 | 32.32 | 0.756 | 58.89 | 14.72 |
|  |  |  |  |  |  |  |  |  |  | 780° C. | 0.604 | 32.39 | 0.758 | 59.31 | 14.83 |
|  |  |  |  |  |  |  |  |  |  | 800° C. | 0.606 | 32.56 | 0.766 | 60.45 | 15.11 |
| Comp. Sample 1 | Y | 3 parts |  |  |  |  | 2.0 | 38.0 | 60.0 | 800° C. | 0.606 | 32.98 | 0.770 | 61.56 | 15.39 |
| Comp. Sample 2 | Y | 2 parts |  |  | 20.0 | 60.0 |  | 20.0 |  | 800° C. | 0.593 | 32.17 | 0.593 | 45.24 | 11.31 |

It is confirmed that the solar cell devices provided with the front electrodes formed by the conductive pastes of the present invention have a low dependency on firing temperature, as well as excellent solar cell characteristics.

What is claimed is:

1. A conductive paste for forming a solar cell electrode, including: a conductive powder comprising silver as a main component; glass frit; and an organic vehicle, wherein the glass frit contains tellurium glass frit having tellurium oxide as a network-forming component, the tellurium glass frit containing 25 to 90 mol % of tellurium oxide and a total of 15.9 to 60 mol % of at least one of tungsten oxide and molybdenum oxide.

2. The conductive paste for forming a solar cell electrode according to claim 1, wherein the tellurium glass frit additionally contains at least one selected from the group consisting of zinc oxide, bismuth oxide and aluminum oxide.

3. The conductive paste for forming a solar cell electrode according to claim 1, wherein the tellurium glass frit contains the following components:
   tellurium oxide: 25 to 90 mol %
   at least one of tungsten oxide and molybdenum oxide:
      15.9 to 60 mol % in total
   zinc oxide: 0 to 50 mol %
   bismuth oxide: 0 to 25 mol %
   aluminum oxide: 0 to 25 mol %.

4. The conductive paste for forming a solar cell electrode according to claim 1, wherein the tellurium glass frit is contained in the amount of 0.1 to 10 parts by weight per 100 parts by weight of the conductive powder.

5. A conductive paste for forming a solar cell electrode, including: a conductive powder comprising silver as a main component; glass frit; and an organic vehicle, wherein the glass frit contains tellurium glass frit having tellurium oxide as a network-forming component, the tellurium glass frit containing 25 to 90 mol % of the tellurium oxide, silver oxide and at least one of tungsten oxide and molybdenum oxide.

6. The conductive paste for forming a solar cell electrode according to claim 5, wherein the tellurium glass frit contains a total of 5 to 60 mol % of at least one of the tungsten oxide and the molybdenum oxide.

7. The conductive paste for forming a solar cell electrode according to claim 5, wherein the tellurium glass frit also contains at least one selected from the group consisting of zinc oxide, bismuth oxide and aluminum oxide.

8. The conductive paste for forming a solar cell electrode according to claim 5, wherein the tellurium glass frit contains the following components:
   tellurium oxide: 25 to 90 mol %
   at least one of tungsten oxide and molybdenum oxide:
      5 to 60 mol% in total
   zinc oxide: 0 to 50 mol %
   bismuth oxide: 0 to 25 mol %
   aluminum oxide: 0 to 25 mol %
   silver oxide: 9.1 to 50 mol %.

9. The conductive paste for forming a solar cell electrode according to claim 5, wherein the tellurium glass frit is contained in the amount of 0.1 to 10 parts by weight per 100 parts by weight of the conductive powder.

* * * * *